United States Patent [19]
Crozier et al.

[11] Patent Number: 6,145,114
[45] Date of Patent: Nov. 7, 2000

[54] METHOD OF ENHANCED MAX-LOG-A POSTERIORI PROBABILITY PROCESSING

[75] Inventors: Stewart Crozier, Kanata; Andrew Hunt, Ottawa; John Lodge, Kanata, all of Canada

[73] Assignee: Her Majesty the Queen in right of Canada, as represented by the Minister of Industry through Communications Research Centre, Ottawa, Canada

[21] Appl. No.: 09/134,151

[22] Filed: Aug. 14, 1998

Related U.S. Application Data

[60] Provisional application No. 60/055,611, Aug. 14, 1997.

[51] Int. Cl.[7] ........................... H03M 13/00; G06F 11/00
[52] U.S. Cl. ........................ 714/794; 714/752; 714/802; 704/200
[58] Field of Search .................................... 714/752, 753, 714/755, 793, 794, 781, 786, 800, 802, 803, 804; 708/420, 530, 531; 704/200

[56] References Cited

U.S. PATENT DOCUMENTS

| 5,271,012 | 12/1993 | Blaum et al. | 371/101 |
|---|---|---|---|
| 5,459,853 | 10/1995 | Best et al. | 395/441 |
| 5,513,192 | 4/1996 | Janku et al. | 371/50.1 |
| 5,537,567 | 7/1996 | Galbraith et al. | 395/441 |
| 5,579,475 | 11/1996 | Blaum et al. | 395/182.05 |
| 5,692,097 | 11/1997 | Yamada et al. | 704/241 |
| 6,041,299 | 3/2000 | Schuster et al. | 704/232 |

*Primary Examiner*—Trinh L. Tu
*Attorney, Agent, or Firm*—Freedman & Associates

[57] ABSTRACT

The invention comprises an enhancement to max-log-APP processing that significantly reduces performance degradation associated with introducing the "max" approximation into log-APP computations, while still maintaining lower computational complexity associated with max-log-APP processing. This enhancement is achieved by adjusting extrinsic information produced by a max-log-APP process where the magnitude of the extrinsic information is reduced, for example, by multiplying it with a scale factor between 0 and 1.

24 Claims, 3 Drawing Sheets

Input probabilities of the bits being zero = {0.5 0.6 0.7}

|

|

APP decoder

|

|

Output probabilities of the bits being zero = {0.54 0.6 0.7}

```
0.123   1.295  -0.528  -0.789  -3.475    <- input values
               ^^^^^^  ^^^^^^  ^^^^^^    <- 3 values are negative
-0.528 -0.123   0.123   0.123   0.123    <- adjustment
---------------------------------------
-0.405  1.172  -0.405  -0.666  -3.352    <- output values
```

Fig. 3

METHOD OF ENHANCED MAX-LOG-A POSTERIORI PROBABILITY PROCESSING

The present application is disclosed in the prior U.S. Provisional Patent Application Ser. No. 60/055,611 filed Aug. 14, 1997.

The present application is related to co-pending application entitled "High-Performance Low-Complexity Error-Correcting Codes" filed on Aug. 14, 1998. The co-pending application is herein incorporated by reference.

FIELD OF THE INVENTION

The invention relates to probabalistic processing of data to correct errors within received data and more particularly to an improvement of max-log-aposteriori probability processing.

BACKGROUND OF THE INVENTION

APP processing

APP stands for "a posteriori probability"; the acronym MAP, which stands for "maximum a posteriori", is also commonly used in the literature to refer to the same concept, though perhaps somewhat erroneously. An APP process is something that accepts input probabilities associated with some entities such as bits, symbols, states, etc., and using knowledge of the "constraints" placed on the entities, determines output probabilities for these entities. One or more constraints are grouped to form a constraint set.

As a specific example of how APP processing is applied, consider a set of bits known to have even parity (i.e. the total number of '1' bits in the set is even), and consider having a probability associated with being a '0' (as opposed to a '1'). Such probability values are output by a demodulator of a modem, for instance. These probability values are provided as input data into an APP process, and the APP process provides an adjusted probability for each bit, the output probabilities taking into account the known constraints. In the present example, the known constraint is that when corrected the set of bits has even parity. Referring to FIG. 2, an illustration of APP decoding of a set of three bits known to have even parity is shown.

The APP calculations for this three-bit example are as follows.

Let $p_i$ represent the input probability that the i-th bit is a '0' bit.

Let $r_i$ represent the output (result) probability that the i-th bit is a '0' bit.

Let $q_i$ represent the probability, calculated using the input probabilities, that all bits, excluding the i-th bit, have even parity. Note that $q_i$ is a likelihood associated with the i-th bit, derived from all bits except the i-th bit.

$p_1 = 0.5$
$p_2 = 0.6$
$p_3 = 0.7$
$q_1 = p_2 * p_3 + (1-p_2)(1-p_3) = 0.54$
$q_2 = p_1 * p_3 + (1-p_1)(1-p_3) = 0.5$
$q_3 = p_1 * p_2 + (1-p_1)(1-p_2) = 0.5$
$r_1 = p_1 * q_1 / (p_1 * q_1 + (1-p_1)(1-q_1)) = 0.54$
$r_2 = p_2 * q_2 / (p_2 * q_2 + (1-p_2)(1-q_2)) = 0.6$
$r_3 = p_3 * q_3 / (p_3 * q_3 + (1-p_3)(1-q_3)) = 0.7$

It is evident that the probabilities associated with the second and third bit did not change as a result of APP processing. This is because the input probability for the first bit is 0.5, which means that any subset of bits that includes the first bit cannot provide any useful parity information and hence $q_2$ and $q_3$ are both 0.5.

Generally, for calculations performed by an APP process, it is assumed that the input probabilities do not incorporate the structural knowledge that the APP process is using as a basis for adjusting the input probabilities. In the above three-bit example, the calculations performed by the APP process assume that the three input probabilities do not incorporate the knowledge that the three bits have even parity. This is not to say that APP processing cannot be used when these underlying assumptions are not satisfied, only that the APP calculations are based on these assumptions. APP processing is often used, and can be highly effective, even when the underlying independence assumptions are not completely satisfied.

APP processing is commonly applied in an iterative manner. A brief description of iterative APP processing is as follows. Consider partitioning the constraints that define the relationships between entities being processed into two or more disjoint subsets. Further, assume that at least some of the entities involved in any given constraint subset are involved in some other constraint subset. That is, the subsets of entities that are associated with the subsets of constraints are overlapping subsets. It will also be assumed that the subsets of entities overlap in such a way so that all entities are affected, either directly or indirectly, by all constraints. Otherwise, a subset of entities and associated constraints could be extracted from the larger problem and processed on their own. Now, if each of the subsets of constraints is processed individually, information garnered from the processing of one subset of constraints can be used in the processing of subsequent constraint subsets. After all constraint subsets have been processed, the first constraint subset is returned to, and the overall process can be repeated. The processing of all of the constraint subsets is then repeated for an arbitrary number of iterations. Such an iterative processing approach is a useful tool in solving problems for which it is either impractical or impossible to consider all constraints simultaneously.

The following example of iterative processing is helpful in understanding the advantages thereto. APP processing is applied in an iterative manner to decode an error-correcting code structure that is represented as a two-dimensional array of bits where every row in the array has even parity and every column in the array has even parity. Such a code is pictured as follows:

i i p
i i p
p p p

The 'i' letters represent information bits, and the 'p' letters represent parity bits. The encoder sets the parity bits so as to make every row have even parity—each row has an eaten number of '1' bits, and to make every column have even parity. After transmission over a noisy channel, a modem demodulator produces probability estimates indicating the likelihood of each of these bits being a '0' bit or a '1' bit, based on the channel information only, without regard to the code structure introduced by the encoder. APP decoding starts with these probability estimates, and using the knowledge that each row of bits was transmitted with even parity, generates improved probability estimates for all of the bits. These improved probability estimates are used as inputs into APP processing for the columns, producing even more reliable probability estimates. The process is repeated, iterated, for a number of iterations. The number of iterations is predetermined, arbitrary, or determined based on a stopping criteria. After the first complete iteration of APP processing of the rows and then the columns, subsequent APP processing operates on input probabilities that do not completely satisfy the independence assumptions inherent in the APP calculations; nonetheless, additional APP processing iterations generally improve decoding performance. After an appropriate number of APP processing iterations, decoding is stopped and decisions about the bits are made based on the final probability values calculated during APP processing, or the soft outputs are passed on to a further process. The term "iterative processing" is used even when only one, or a partial, iteration is performed.

The mathematical details of APP processing are described in the literature; for example, see J. Erfanian, S. Pasupathy, G. Gulak, "Reduced complexity symbol detectors with parallel structures for ISI channels", *IEEE Trans. on Communications,* Vol. 42, No. 2/3/4, pp. 1661–1671, February/March/April 1994. For a discussion of APP processing in the context of iterative decoding of error-correcting codes, see J. Hagenauer, E. Offer, and L. Papke, "Iterative decoding of binary block and convolutional codes", *IEEE Transactions on Information Theory,* Vol. 42, No. 2, pp. 429–445, March 1996.

Log-APP

Log-APP is a form of APP processing where the quantities manipulated are not probabilities, but rather "log-probability quantities" derived from probabilities. The term "log-probability quantity," in the context of this document, refers to log-probabilities, log-probabilities with offsets, sums of log-probabilities, differences of log-probabilities, and combinations of these. Note that a "log-probability" is simply the logarithm of a probability; the base of the logarithm is arbitrary. Standard log-APP processing, without any approximations or enhancements, is, in mathematical terms, exactly equivalent to APP processing. In FIG. 1 the following definitions apply with reference to iterative log-APP processing and iterative max-log-APP processing:

$L_{in}$ represents a set of two or more input log-probability quantities;

$L_{out}$ represents a set of two or more output log-probability quantities; and, $L_{ex}$ represents a set of two or more output extrinsic values.

The feedback branches are only followed when iterative processing is performed with more than 1 iteration.

Manipulating log-probability quantities, rather than working with the probabilities themselves, is generally preferred due to computational issues such as the finite-precision representation of numbers. Also, in some sense, log-probability quantities are more "natural" quantities to work with than probabilities, as log-probability quantities represent "information", and log-APP processing then amounts to adding extra "information" to the input "information." This is well known to those of skill in the art in the field of "Information Theory".

Log-likelihood ratios

A common log-probability quantity used in log-APP processing is a "log-likelihood ratio" (LLR), which is a logarithm of a probability ratio; that is, a difference between two log-probabilities. Log-likelihood ratios (LLRs) are often convenient log-probability quantities to use. Consider the case where the entities being manipulated are bits. For this case, the log-likelihood ratio for a particular bit being a '0' bit is defined as:

$$LLR_{bit} = \log(p/(1-p))$$

where "p" is the probability of the bit in question being a '0' bit. Observe that such a "log-likelihood ratio" has the following properties:

p→1: LLR→+∞ (approaching certainty)
p=0.5: LLR=0 (no information)
p→0: LLR→−∞ (approaching impossibility)

Though the example above illustrates a way of using LLRs with binary entities (i.e. bits, which can only be either '0' or '1'), the concept of log-likelihood ratios is not restricted to this simple case and can be applied to M-ary symbols, states, and so forth. When the entities being considered are any of "M" choices, at most M-1 log-likelihood ratios are needed to fully describe the likelihoods associated with any particular entity. For example, with an 8-ary symbol alphabet, no more than 7 LLRs are required to fully characterize the probabilities associated with any particular symbol.

Max-log-APP

"Max-log-APP" is a form of log-APP processing where some or all calculations of expressions of the form $\log_b(b^x+b^y)$ are approximated as simply $\log_b(b^x+b^y) \approx \max(x,y)$. The letter "b" is used to denote the base of the logarithm, which is arbitrary. The letters "x" and "y" represent the quantities being "combined", which are typically log-probability quantities having the same base "b". As an example, $\log_e(e^2+e^3)$, where e is the base for natural logarithms, would be approximated as simply "3", whereas the answer to three decimal places is 3.313. Introducing this approximation into the log-APP calculations generally results in a degradation of the results of an overall process of which the max-log-APP process is a part, but using the approximation can provide a significant reduction in computational complexity and thereby improve speed of processing. Max-log-APP processing is not, in mathematical terms, equivalent to standard log-APP processing, but is an approximation thereto.

It may not be immediately apparent that a given process is indeed a max-log-APP process. For example, consider a process that operates in the following manner. The input to the process is a set of estimates associated with a set of bits known to have even parity. Positive estimates indicate that a bit is more likely to be a '0' than a '1', and conversely, negative estimates indicate that a bit is more likely to be a '1' than a '0'. The process first establishes the "parity" of the set of input bit estimates by counting how many of the input values are negative. When an even number of these values are negative, the set of input estimates is considered to have even parity, and when an odd number are negative, then the set of input estimates is considered to have odd parity and includes at least one bit in error. Using this parity result, the process then either "strengthens" or "weakens" each input bit estimate to produce the corresponding output bit estimate. An input bit estimate is "strengthened" when the overall parity is even, and "weakened" when the overall parity is odd. The magnitude of the strengthening or weakening for each bit is determined by the smallest magnitude of all of the input estimates, excluding the estimate associated with the bit under consideration. Referring to FIG. 3, an illustration of the operation of this soft-in soft-out (SISO) process is shown. "Soft-in soft-out" is used here to mean that the process accepts as input, and produces as output, estimates of, rather than decisions about, entities being considered.

Though not immediately apparent, this process is in fact a max-log-APP process. A proof of this relationship is not presented here in order to avoid unnecessary detail, but the proof is determinable as follows. One begins with the log-APP calculations for a set of bits having even parity using log-likelihood ratios as the quantities being manipulated, introduce the "max" approximation throughout, and then simplify. The end result is a process similar to that described above. This example shows how simple some log-APP processes become when the "max" approximation is employed and helps to highlight the advantages of their implementation.

Analysing a max-log-APP process beginning with its simplified form, rather than beginning with its non-approximated log-APP origin, often provides useful insight into how the process operates, and how this operation differs from true log-APP processing. For example, consider a bit-wise max-log-APP process for a binary convolutional code. In many cases, such a process is thought of as determining, for each bit for which a soft output is desired, two path metrics: the path metric of the most likely sequence having a '0' bit in the position being considered, and the path metric of the most likely sequence having a '1' bit in the position being considered, and then using these two path metrics to calculate an "improved" estimate for the bit. That is, instead of using all possible paths, only two paths are used to calculate the output for any given bit position: the best '0'-bit path, and the best '1'-bit path.

Discussions on max-log-APP processing are found in the literature; for example, see J. Erfanian, S. Pasupathy, G. Gulak, "Reduced complexity symbol detectors with parallel structures for ISI channels", *IEEE Trans. on Communications*, Vol. 42, No. 2/3/4, pp. 1661–1671, February/March/April 1994.

Extrinsic information

The term "extrinsic information" is used herein to refer to a difference between output values and input values of a log-APP process including a max-log-APP process. Specifically, for any given entity upon which the log-APP process operates, the difference between the associated output log-probability quantity and the corresponding input log-probability quantity is termed the "extrinsic information" for the given entity, for the log-APP process being considered. Note that in determining this difference between the output log-probability quantity and the input log-probability quantity, the output log-probability quantity is expressed in a form that is consistent with that used for the input log-probability quantity. That is, the output log-probability quantity is expressed in such a way so that it is interpretable in the same way as the input log-probability quantity, and hence the output log-probability quantities are comparable directly with the input log-probability quantities.

For convenience, the extrinsic information associated with a given log-APP process is referred to as being "produced" by the process.

SUMMARY OF THE INVENTION

The invention comprises an enhancement to max-log-APP processing that significantly reduces performance degradation associated with introducing the "max" approximation into log-APP computations, while still maintaining lower computational complexity associated with max-log-APP processing. This enhancement is achieved by adjusting extrinsic information produced by a max-log-APP process. Generally the magnitude of the extrinsic information is reduced. The rationale behind this idea is twofold: first, the extrinsic information values produced by a max-log-APP process are, on average, larger in magnitude than the values produced by a non-approximated log-APP process, and so the smaller magnitudes produced by the enhanced process reduce or eliminate this bias; second, the extrinsic information values produced by a max-log-APP process are inherently inaccurate, because of the "max" approximation, and the smaller magnitudes produced by the enhanced process reflect this reduced level of accuracy which is in essence a reduced level of confidence. The ultimate reason for using the enhancement, however, is that through its use, an iterative processing system achieves an overall performance level that rivals that of a system that uses non-approximated log-APP processing, while still realising the dramatic reductions in complexity afforded by introducing a "max" approximation into the log-APP calculations.

According to the invention there is provided a method of max-log-APP processing of input log-probability quantities, comprising the steps of:

(a) producing first output log-probability quantities using a max-log-APP process based on a constraint set, each of said first output log-probability quantities corresponding to an input log-probability quantity from the input log-probability quantities;

(b) computing a first extrinsic information value for each first output log-probability quantity from the first output log-probability quantities, said extrinsic information value computed as the difference between said output log-probability quantity and the corresponding input log-probability quantity;

(c) for each first extrinsic information value, producing a corresponding second extrinsic information value based on the first extrinsic information values, at least one of the second extrinsic information values being smaller in magnitude than the corresponding first extrinsic information value, and wherein said second extrinsic information value and the corresponding first extrinsic information value correspond to a same input log-probability quantity; and, (d) adding each of said second extrinsic information values to the corresponding input log-probability quantity to provide second output log-probability quantities.

According to the invention there is provided a method of max-log-APP processing of input log-probability quantities associated with an error correcting code wherein the error-correcting code is a binary code having one or more even-parity codings, the method comprising the step of:

for each even-parity set, storing extrinsic information in the form of a minimum magnitude value, a second magnitude value, a location index associated with the minimum magnitude value, and a sign bit for each bit in the even-parity set.

According to the invention there is provided a method of max-log-APP processing comprising the step of reducing on average the difference between output log-probability quantities and corresponding input log-probability quantities.

BRIEF DESCRIPTION OF THE FIGURES

An exemplary embodiment of the invention will now be described in conjunction with the attached figures, in which:

FIG. 3 is a simplified diagram of a prior art method of max-log-APP processing of a five bit code, where the five bits are known to have even parity.

DETAILED DESCRIPTION OF THE INVENTION

Figure 4:
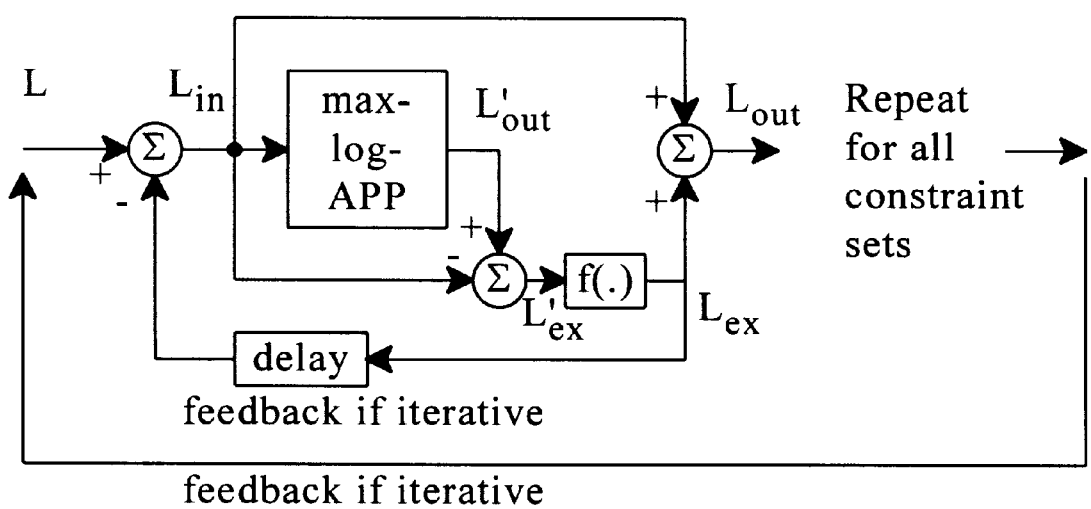
FIG. 4 is a simplified block diagram of a method according to the invention using max-log-APP processing in the context of iterative processing with two or more constraint sets.

Referring to FIG. 4, the following notation is used:

$L_{in}$ represents a set of two or more input log-probability quantities;

$L_{out}$ represents a set of two or more output log-probability quantities;

$L_{ex}$ represents a set of two or more output extrinsic values;

$L'_{out}$ represents a set of two or more intermediate log-probability quantities;

$L'_{ex}$ represents a set of two or more intermediate extrinsic values;

f(.) represents a reduction function that reduces a magnitude of at least one of the extrinsic information values.

The feedback branches are only followed when iterative processing is performed with more than 1 iteration.

According to an embodiment of the invention as shown in FIG. 4, reduction of the average magnitude of the extrinsic information determined according to a known max-log-APP process is performed. The reduction is achieved through multiplication of the extrinsic information by a positive scale factor less than one (not including 0, which is not considered a positive number). Optionally, the scale factor varies between processing iterations, and between constraint sets within a same iteration. Alternatively, a same scale factor is used.

Selection of a scale factor for a given application depends, to some extent, on the nature of the overall log-APP process. For example, iterative max-log-APP decoding of a memory-4 Turbo-code, as described below, requires, in general, different scale factors than iterative max-log-APP decoding of a memory-2 Turbo-code. This is believed to be so because introducing the "max" approximation into the log-APP calculations effects extrinsic information values produced differently. Essentially, the scale factor is determined through experimentation and an acceptable scale factor between 0 and 1 is selected based on experimental results. Of course, the effects of the approximation on the process, when known, is a useful indicator in approximating the scale factor at a start of experimentation.

Operating conditions also affect performance results using certain scale factors. For example, in an iterative decoding system for error-correcting codes, the desired error-rate defines an operating signal-to-noise ratio (SNR), which in turn influences selection of scale factors. In general, a higher SNR is indicative of a larger scale factor being applicable. This general guideline arises from the fact that as the SNR approaches infinity, max-log-APP output values converge to log-APP output values.

Also, the number of processing iterations performed influences the scale factors. In general, with fewer iterations, larger scale factors are selected. Increasing the number of iterations allows reduction of the scale factors.

Optionally, the scale factor(s) used are independent of the data processed. Alternatively, the scale factor(s) used depend on the data by, for example, determining w the scale factors dynamically based on current operating conditions. For example, an estimate of the current signal-to-noise ratio (SNR) is used to "look-up" a scale factor from a table.

Determining appropriate scale factors is performed in one of many different ways. An approach for determining a set of fixed scale factors is to simply perform an exhaustive "grid" search of scale factors, where performance of the overall system is simulated for each set of scale factors, and the set of scale factors that gives best overall performance is selected for use in the final system. Since such a system is easily automated, it is not a cumbersome task to implement and it generates an adequate set of scale factors for most applications.

In another embodiment, the method of the present invention is incorporated in some processing iterations but not in all iterations. For example, using standard max-log-APP processing for a last constraint set of a last iteration often provides better overall performance.

The reasons this embodiment is preferred are as follows:

The method according to the preferred embodiment provides low computational complexity. Keeping the computational complexity low increases usefulness of the invention. The reason for using the "max" approximation is to reduce the computational complexity of log-APP processing. When the computational requirements associated with an enhancement are high, a main advantage of using max-log-APP is diminished, and log-APP processing becomes a more preferred approach.

With certain scale factors, even the multiplication operation is eliminated, and simpler shift and add operations are used. For example, multiplication by the scale factor 0.625 is achieved using two shifts and one add. This option of eliminating multiplies is particularly relevant for high-speed VLSI implementations, where multiplication is a "costly" operation when compared to bit operators and addition.

Despite its low complexity, the present method works well, providing results similar to those achieved with log-APP calculations. For example, in iterative decoding of "Turbo-codes", a family of error-correcting codes that is discussed below, using max-log-APP processing instead of log-APP processing results in approximately a 0.4 dB degradation in the signal-to-noise ratio (SNR) required to achieve error rates of common interest as discussed in P. Robertson, P. Hoeher, E. Villebrun, "Optimal and Sub-Optimal Maximum a Posteriori Algorithms Suitable for Turbo Decoding", European Transactions on Telecommunications (ETT), Vol. 8, No. 2, pp. 119–125, March–April 1997. That is, as a result of introducing the "max" approximation, a transmitter must increase its power by 0.4 dB in order for a receiver to achieve a same error-rate. By appropriately scaling the extrinsic information according to the preferred embodiment, however, this degradation was reduced to about 0.1 dB for rate ½ codes.

Introduction of the "max" approximation into log-APP calculations causes a non-reversible loss of information. That is, regardless of how sophisticated an approach is used to enhance the extrinsic information produced by a max-log-APP process, it is not possible to guarantee that all extrinsic information values produced by such an enhanced process exactly match those generated by a standard log-APP process. Thus, regardless of the embodiment of the invention that is adopted, some performance degradation at some operating point is expected.

Any increase in the computational complexity of the present method is weighed against overall performance gains realized. When the performance gains realized are minimal and the extra complexity significant, then the extra complexity is likely not justified in terms of performance versus complexity. Since an enhanced max-log-APP process typically forms part of a larger iterative processing system, by reducing the processing requirements associated with performing each processing iteration, additional iterations become possible. Because of this, a more approximate but lower complexity processing approach sometimes provides the same or better overall system performance than a more accurate but more involved processing approach.

Scalability of the max-log-APP process is maintained when present. Scalability is desirable in an iterative processing system. When the "max" approximation is incorporated throughout the calculations associated with a particular log-APP process, the resulting process is often a scalable process. The exact meaning of this term as used herein follows: Let input x produce output f(x); if the input ax produces the output af(x), for all real numbers a, and all possible inputs x, then the process is called scalable. Not all max-log-APP processes are scalable; but a max-log-APP process can be scalable if the "max" approximation is used throughout the log-APP calculations.

In an iterative processing system employing max-log-APP processing, if all of the max-log-APP processes are scalable, and provided that any additional processing is also scalable, then the overall iterative processing system is scalable. If the overall system is scalable, then any scaling of the values used to begin the iterative process is of no consequence; such a scaling of input values simply results in a corresponding scaling of final output values. This is a useful property because it follows that for a scalable system, no adjustment is required to properly set the "signal level" of the values that are input into the iterative processing system. Properly setting this input signal level often involves a significant amount of processing. For example, it is often required to estimate the signal and noise levels of the input in order to adjust its level appropriately. Thus, using the "max" approximation in an iterative log-APP processing system reduces an amount of processing required throughout the system, in addition to reducing the computational requirements of the iterative process itself.

Returning to the preferred embodiment of the invention, when an iterative max-log-APP processing system is scalable before implementation of the present method, the present method as outlined above maintains this scalability. However, many alternative approaches result in a non-scalable iterative processing system. In summary, for many applications, the preferred embodiment of the invention provides an optimal trade-off between enhanced performance and increased computational complexity while maintaining simplicity and scalability. Further, as set out below, the present invention provides a method of performing max-log-APP processing requiring reduced memory storage for the extrinsic information.

Areas of application for the invention

The present invention has application in a wide variety of iterative processing applications. Two exemplary applications are iterative decoding of "Turbo-codes", and iterative decoding of "Hyper-codes". These are described below.

Enhancement to max-log-APP processing as applied to the decoding of Turbo-codes

Turbo-codes are a family of powerful error-correcting codes that were recently invented. Some descriptions of Turbo-codes are presented in U.S. Pat. No. 5,446,747, issued April 1995, and U.S. Pat. No. 5,563,897, issued October 1996. These codes have structures consisting of two or more overlapping systematic convolutional codes. The decoding of Turbo-codes is performed in an iterative manner, using soft-in soft-out processing of the component convolutional codes. Using non-approximated log-APP processing in the decoding of Turbo-codes provides excellent error-rate performance, but the computational complexity associated with using this approach is quite high, making the approach not practical for many high data-rate communications applications. For this reason, there is significant research effort directed towards the development of lower-complexity decoding techniques suitable for Turbo-codes. Research in this area has focused on an approach called SOVA, which stands for "Soft Output Viterbi Algorithm." Examples of this are disclosed in U.S. Pat. No. 5,181,209, issued January 1993 and in L. Papke, P. Robertson, E. Villebrun, "Improved Decoding with the SOVA in a Parallel Concatenated (Turbo-code) Scheme", *Proceedings, IEEE International Conference on Communications* (ICC, Dallas, USA, 1996), pp. 102–106.

With the enhancement of the present invention, however, the performance of max-log-APP decoding of Turbo-codes is significantly improved, making enhanced max-log-APP a viable competitor to SOVA as a technique suitable for lower-complexity decoding of Turbo-codes.

Since Turbo-codes offer unmatched error-correcting capability for many communications applications, and because using enhanced max-log-APP processing for the decoding of these codes offers a very attractive combination of excellent performance and moderate computational complexity, the decoding of Turbo-codes is considered one of the prime areas of application for the present invention. Error-rate performance results for enhanced max-log-APP decoding of Turbo-codes are presented in S. Crozier, A. Hunt, K. Gracie, J. Lodge, "Performance and Complexity Comparison of Block Turbo-Codes, Hyper-Codes, and Tail-Biting Convolutional Codes", Proceedings, 19th Biennial Symposium on Communications (Kingston, Canada, June 1998), pp. 84–88 and in K. Gracie, S. Crozier, A. Hunt, J. Lodge, "Performance of a Low-Complexity Turbo Decoder and its Implementation on a Low-Cost, 16-Bit Fixed-Point DSP", Proceedings, 10th International Conference on Wireless Communications (Wireless '98, Calgary, Canada, July 1998), pp. 229–238. These references are incorporated herein by reference.

Turbo-codes are generally known as is max-log-APP decoding of Turbo-codes. It is therefore a straightforward matter for one of skill in the art to implement the present invention for use with iterative decoding of Turbo-codes.

Enhancement to max-log-APP processing as applied to the decoding of Hyper-codes

Another area of application for the invention that warrants mention is in iterative decoding of "Hyper-codes." Hyper-codes are a new class of error-correcting codes that were developed to exploit the potential of enhanced max-log-APP processing in connection with error-correction coding. Descriptions of these codes are provided in A. Hunt, *Hyper-codes: High-performance low-complexity error-correcting codes*, Master's thesis, Carleton University, Ottawa, Canada, May 1998, in A. Hunt, S. Crozier, D. Falconer, "Hyper-codes: High-performance low-complexity error-correcting codes", *Proceedings, 19th Biennial Symposium on Communications*, Kingston, Canada, June 1998, pp. 263–267, and in the co-pending application. Since Hyper-codes are new, some introduction is required in order to establish a relation between them and the present invention.

An error-correction code (hereinafter referred to as 'code') is a mapping of information messages to codewords, each codeword being an ordered collection of symbols from some finite symbol set. Each codeword of a code has a same codeword length, which is the number of symbols in a codeword. The codeword length may be infinite. A symbol set is simply a collection of distinct identifiers, such as $\{0\ 1\}$ or $\{1\ \beta\beta^2\beta^2\}$. The codewords of a code form a proper subset of all possible ordered collections of symbols from the symbol set, the size of each collection being equal to the codeword length. A code with a finite codeword length is called a block code.

The term "sum-to-identity code" refers herein to a block code where "addition" of all symbols making up any given codeword sums to an "identity" symbol. To have a "sum-to-identity" code, the symbol set of the code has an associated operator, herein called "addition", defined over the members of the symbol set, with one of the symbols in the symbol set being the "identity element" for the addition operator. Further, this addition operator is commutative - the operator is insensitive to the ordering of the operands (i.e. a+b=b+a). In mathematical terms, the symbol set together with the addition operator form an "abelian group". For example, a set of integers modulo-M and an operation of addition modulo-M form an abelian group, with "0" being the identity element. A second example, which in fact is equivalent or "isomorphic" to the first example, is a set of M complex symbols used to define M-ary phase-shift keying (M-ary PSK) modulation. In this example, the operation is complex multiplication, the symbols are phasors distributed evenly around a unit circle, and the identity element is "1".

An "even-parity" code is a simple example of a sum-to-identity code. An "even-parity" code is a code where the symbols are bits and where there is an even number of '1' bits in each codeword.

If a set of symbols can be arranged, conceptually, into an N-dimensional array, N being any arbitrary integer greater than or equal to 1, such that addition along any dimension of the array always produces an identity sum, then the set of symbols constitutes a sum-to-identity hyper-box, of dimension N. For example, consider the following set of bits (i.e. M=2), presented in an arrangement that illustrates a code structure inherent in the bits.

0 1 1 0
1 0 0 1
0 1 0 1
1 0 1 0

Every row has an even number of '1' bits (i.e. sums to 0 in a modulo-2 sense). Likewise, every column has an even number of '1' bits. The set of bits constitutes a two-dimensional "sum-to-identity hyper-box". Optionally, the lengths of the dimensions of a sum-to-identity hyper-box are not equal.

Sum-to-identity hyper-boxes are used as a basis for error-correcting code structures. Error-correcting codes that have code structures consisting of one or more sum-to-identity hyper-boxes, of arbitrary size and dimension, together with extra symbols that augment the basic sum-to-identity box (es), are examples of "Hyper-codes." Such codes are attractive for use in digital communications systems because they often provide powerful error-correcting capability, especially for high rate codes.

Optionally, Hyper-codes are decoded in an iterative manner using log-APP processing. Using non-approximated log-APP processing for decoding provides very good error-rate performance, but the associated computational complexity is somewhat high. Max-log-APP decoding, on its own, has much lower computational complexity, but results in a significant degradation in error-rate performance. However, by using the present invention, especially in its preferred embodiment, Hyper-codes are decoded in a manner that provides very good error-rate performance that is computationally efficient. The degradation from true log-APP is typically less than 0.1 dB for code rates greater than ½.

Hyper-code structures, together with enhanced max-log-APP processing, provide an error-correcting solution that offers error-rate performance far exceeding common standards in use today such as constraint-length 7 convolutional encoding with Viterbi decoding using reasonable decoding complexity.

A brief introduction to Hyper-codes and example error-rate performance using enhanced max-log-APP decoding are presented in. A. Hunt, S. Crozier, D. Falconer, "Hyper-codes: High-performance low-complexity error-correcting codes", *Proceedings, 19th Biennial Symposium on Communications,* Kingston, Canada, June 1998, pp. 263–267. A more in-depth treatment of the subject and additional performance results can be found in A. Hunt, *Hyper-codes: High-performance low-complexity error-correcting codes,* Master's thesis, Carleton University, Ottawa, Canada, May 1998. Both these references are hereby incorporated by reference.

Figures 1, 2:
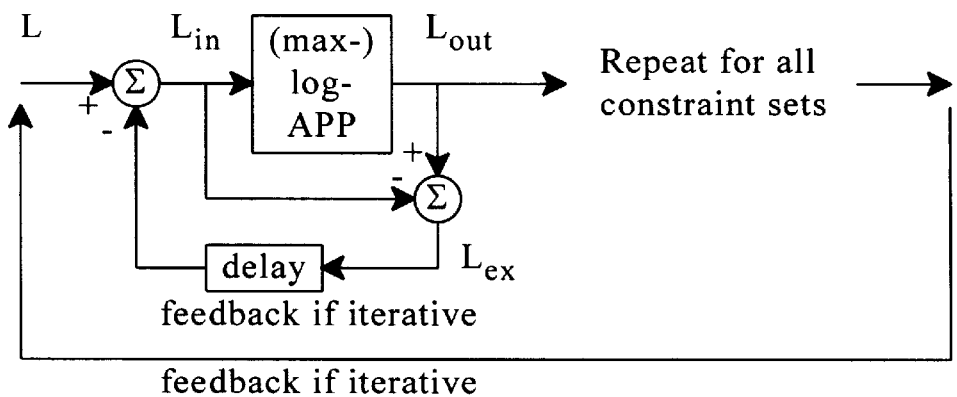
FIG. 1 is a simplified block diagram of a prior art method of log-APP processing or max-log-APP processing in the context of iterative processing with two or more constraint sets.
FIG. 2 is a simplified diagram of a prior art method of APP processing a three-bit code, where the three bits are known to have even parity.

It is known that the extrinsic information must be stored when multiple constraint sets and iterative processing are used, as illustrated in FIGS. 1 and 4. According to an embodiment of the invention, a further advantage is achieved by storing the extrinsic information using less memory than is required with true log-APP processing. As an example, consider a set of K bits with an even parity constraint. Using true log-APP processing, K distinct extrinsic information values are generated, one for each bit, therefore, K storage locations are required. When max-log-APP processing is used according to the present embodiment, the extrinsic information takes the form shown in FIG. 3; that is, the extrinsic information is completely characterized by a minimum magnitude value, a second magnitude value, the location index of the minimum magnitude value, and K sign bits. The location index according to the present embodiment only requires a few bits for typical values of K. This method of storing the extrinsic information for even-parity sets results in a significant reduction in memory use over prior art max-log-APP processing, especially for large values of K. The reduction in memory often speeds processing because many processors experience a processing bottleneck due to time required for performing memory transfers.

The usefulness of the present invention extends beyond the applications highlighted above. For example, iterative multi-user detection, joint demodulation and decoding, joint synchronization and decoding, and joint equalization and decoding are other applications where the enhancement is useful. Numerous other embodiments of the invention are envisioned without departing from the spirit or scope of the invention.

What is claimed is:

1. A method of max-log-APP processing of input log-probability quantities, comprising the steps of:

(a) producing first output log-probability quantities using a max-log-APP process based on a constraint set, each of said first output log-probability quantities corresponding to an input log-probability quantity from the input log-probability quantities;

(b) computing a first extrinsic information value for each first output log-probability quantity from the first output log-probability quantities, said extrinsic information value computed as the difference between said output log-probability quantity and the corresponding input log-probability quantity;

(c) for each first extrinsic information value, producing a corresponding second extrinsic information value based on the first extrinsic information values, at least one of the second extrinsic information values being smaller in magnitude than the corresponding first extrinsic information value, and wherein said second extrinsic information value and the corresponding first extrinsic information value correspond to a same input log-probability quantity; and, (d) adding each of said second extrinsic information values to the corresponding input log-probability quantity to provide second output log-probability quantities.

2. A method of max-log-APP processing as defined in claim 1, wherein each of the second extrinsic information values is smaller in magnitude than the corresponding first extrinsic information value.

3. A method of max-log-APP processing as defined in claim 1, wherein step (c) is performed by multiplying a first extrinsic value by a scale factor less than one to produce the corresponding second extrinsic value.

4. A method of max-log-APP processing as defined in claim 1, wherein step (c) is performed by multiplying each first extrinsic value by a scale factor less than one to produce the corresponding second extrinsic value.

5. A method of max-log-APP processing as defined in claim 4, wherein the scale factor is determined independent of scaling of the input log-probability quantities.

6. A method of max-log-APP processing as defined in claim 1, wherein step (c) is performed by multiplying each first extrinsic value by a same scale factor less than one to produce the corresponding second extrinsic value.

7. A method of max-log-APP processing as defined in claim 1 comprising the step of:

(e) performing steps (a) to (d) for a different constraint set to determine different second output log-probability quantities, and wherein the second output log-probability quantities previously provided are used as input log-probability quantities for step (e).

8. A method of max-log-APP processing as defined in claim 7 comprising the step of:

(f) iterating steps (a) through (e), wherein the input log-probability quantities of a subsequent iteration are based on the different second output log-probability quantities of a previous iteration.

9. A method of max-log-APP processing as defined in claim 8 wherein step (c) is performed by multiplying a first extrinsic value by a scale factor less than one to produce the corresponding second extrinsic value.

10. A method of max-log-APP processing as defined in claim 9 wherein the scale factor is varied from one iteration to the next.

11. A method of max-log-APP processing as defined in claim 7 wherein step (c) is performed by multiplying a first extrinsic value by a scale factor less than one to produce the corresponding second extrinsic value and wherein the scale factor is varied from step (c) to step (e).

12. A method of max-log-APP processing as defined in claim 1 for decoding error-correcting codes, the input log-probability quantities relating to symbols of the error-correcting codes.

13. A method of max-log-APP processing as defined in claim 12, wherein the error-correcting code has one or more convolutional codings.

14. A method of max-log-APP processing as defined in claim 12, wherein the error-correcting code has one or more sum-to-identity hyper-boxes.

15. A method of max-log-APP processing as defined in claim 12, wherein the error-correcting code is a Turbo-code.

16. A method of max-log-APP processing as defined in claim 12, wherein the error-connecting code is a Hyper-code.

17. A method of max-log-APP processing as defined in claim 12, wherein log-probability quantities are log-likelihood ratios (LLRs) and wherein the symbols associated with log-likelihood ratios are bits.

18. A method of max-log-APP processing as defined in claim 12, wherein the error-correcting code is a binary code having one or more even-parity constraints, the method comprising the step of, for a set of bits with even-parity, storing the second extrinsic information in the form of a minimum magnitude value, a second magnitude value, a location index associated with the minimum magnitude value, and a sign bit for each bit in the even-parity set.

19. A method of max-log-APP processing as defined in claim 12, wherein the error-correcting code is a binary code having one or more even-parity constraints, the method comprising the step of, for each set of bits with even-parity, storing the second extrinsic information in the form of a minimum magnitude value, a second magnitude value, a location index associated with the minimum magnitude value, and a sign bit for each bit in the even-parity set.

20. A method of max-log-APP processing as defined in claim 1, wherein log-probability quantities are log-likelihood ratios (LLRs).

21. A method of max-log-APP processing of input log-probability quantities associated with an error correcting code wherein the error-correcting code is a binary code having one or more even-parity constraints, the method comprising the step of:

for a set of bits with even-parity, storing extrinsic information in the form of a minimum magnitude value, a second magnitude value, a location index associated with the minimum magnitude value, and a sign bit for each bit in the even-parity set.

22. A method of max-log-APP processing of input log-probability quantities associated with an error correcting code as defined in claim 21 wherein the extrinsic information in the form of a minimum magnitude value, a second magnitude value, a location index associated with the minimum magnitude value, and a sign bit for each bit in the even-parity set is stored for each set of bits with even-parity.

23. A method of max-log-APP processing comprising the step of reducing on average the difference between output log-probability quantities and corresponding input log-probability quantities.

24. A method of max-log-APP processing as defined in claim 23 wherein the difference is reduced using a transfer function.

* * * * *

UNITED STATES PATENT AND TRADEMARK OFFICE
CERTIFICATE OF CORRECTION

PATENT NO.   : 6,145,114
DATED        : November 7, 2000
INVENTOR(S)  : Crozier et al.

It is certified that error appears in the above-identified patent and that said Letters Patent is hereby corrected as shown below:

Column 1
Line 14: "aposteriori" should read --a posteriori--.

Column 2
Lines 43-45: "iip iip ppp" should read:--iip iip ppp--.

Column 7
Line 58: "{1 β β² β²}" should read--{1 β β² β³}--.

Delete the illustrative figure on the front page of the patent and substitute therefore Figure 4.

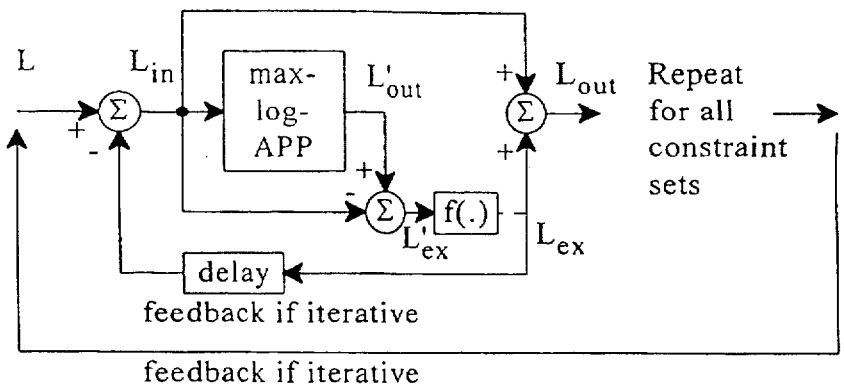

Signed and Sealed this

Twenty-fifth Day of September, 2001

Attest:

NICHOLAS P. GODICI
*Attesting Officer*   *Acting Director of the United States Patent and Trademark Office*

UNITED STATES PATENT AND TRADEMARK OFFICE
CERTIFICATE OF CORRECTION

PATENT NO. : 6,145,114
DATED : November 7, 2000
INVENTOR(S) : Crozier et al.

Page 1 of 1

It is certified that error appears in the above-identified patent and that said Letters Patent is hereby corrected as shown below:

Column 1,
Line 14, "aposteriori" should read -- a posteriori --.

Column 2,
Lines 43-45, "iip should read -- iip
            iip          iip
            p p p"       ppp --.

Column 7,
Line 58. "w the scale" should read -- the scale --.

Column 10,
Line 61, "{1 β β² β²}" should read -- {1 β β² β³} --.

Delete the illustrative figure on the front page of the patent and substitute therefore Figure 4.

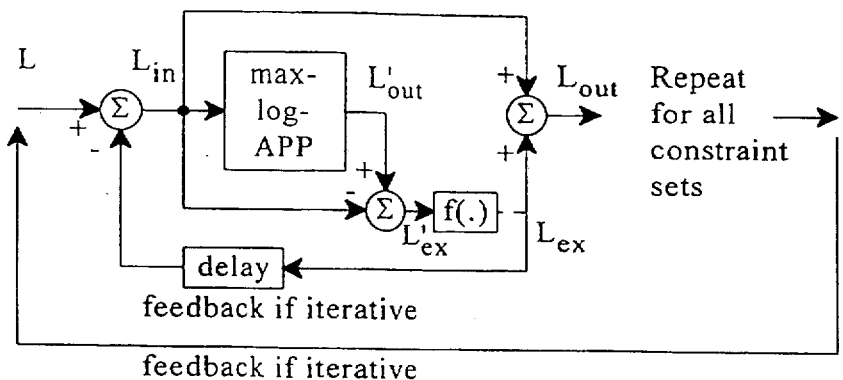

This Certificate supercedes Certificate of Correction issued September 25, 2001.

Signed and Sealed this

Sixth Day of November, 2001

Attest:

NICHOLAS P. GODICI
Attesting Officer      Acting Director of the United States Patent and Trademark Office